United States Patent
Butler (10) Patent No.: US 7,468,782 B2
(45) Date of Patent: Dec. 23, 2008

(54) LITHOGRAPHIC APPARATUS, POSITION QUANTITY CONTROLLER AND CONTROL METHOD WITH FEEDFORWARD SIGNAL

(75) Inventor: Hans Butler, Best (NL)

(73) Assignee: ASML Netherlands B.V., Veldhoven (NL)

(*) Notice: Subject to any disclaimer, the term of this patent is extended or adjusted under 35 U.S.C. 154(b) by 25 days.

(21) Appl. No.: 11/090,698

(22) Filed: Apr. 25, 2005

(65) Prior Publication Data

US 2006/0238739 A1    Oct. 26, 2006

(51) Int. Cl.
G03B 27/62    (2006.01)
G03B 27/58    (2006.01)

(52) U.S. Cl. .......................................... 355/75; 355/72
(58) Field of Classification Search ............... 355/72, 355/75; 318/560–565, 519; 310/10, 12; 356/399; 202/150
See application file for complete search history.

(56) References Cited

U.S. PATENT DOCUMENTS 6,259,511  B1*  7/2001  Makinouchi et al. .......... 355/53
2002/0196421  A1*  12/2002  Tanaka et al. ................. 355/72
2003/0043354  A1*  3/2003  Butler ........................ 355/53

* cited by examiner

Primary Examiner—Hung Henry Nguyen
Assistant Examiner—Chia-how Michael Liu
(74) Attorney, Agent, or Firm—Pillsbury Winthrop Shaw Pittman LLP (57) ABSTRACT

A lithographic apparatus includes a first movable element and a first control system to control a position quantity thereof. Also, the lithographic apparatus includes a second movable element and a second control system to control a position quantity thereof. To reduce a tracking error, i.e., a relative error between the first and second movable parts, a feedforward table is provided which includes a feedforward table programming to generate a feedforward signal in synchronism with a setpoint signal to be provided to the first and second control systems. The feedforward is provided to the first control system to correct the position quantity of the first movable element so as to reduce the relative error between the position quantities of the first and second movable elements.

18 Claims, 8 Drawing Sheets

LITHOGRAPHIC APPARATUS, POSITION QUANTITY CONTROLLER AND CONTROL METHOD WITH FEEDFORWARD SIGNAL

BACKGROUND OF THE INVENTION

1. Field of the Invention

The present invention relates to a lithographic apparatus, a controller to control a position quantity of a first and a second movable element, and a method to control a position quantity of the first and second movable elements.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus comprises a reticle stage to hold the reticle and a wafer stage to hold a wafer. A reticle stage positioning system is provided to position the reticle stage and a wafer stage positioning system is provided to position the wafer stage. The positioning systems may comprise e.g., control loops arranged for a positioning of the respective stages. As the pattern provided by the reticle is to be projected onto the wafer with a high accuracy, an accurate positioning of the reticle stage as well as the wafer stage is important. Furthermore, an accurate tracking of a position of the reticle stage and a position of the wafer stage (thus a low relative position error) is desired. If both stages show a position error, an effect thereof may be substantially less in a situation where an actual position of the reticle "follows" an actual position of the wafer stage, as compared to a situation where position errors of the stages show no correlation. In other words, if the reticle stage and the wafer stage both show a substantially same error, its effect may be significantly less than an effect of uncorrelated errors of the stages.

To obtain a high tracking, i.e., to make sure that movement and/or a position of the reticle stage and wafer stage match as good as possible, thus showing a low relative error, a feedforward may be included which provides a feedforward signal to e.g., the reticle stage based on a setpoint input provided to the wafer stage or based on an error signal in a control loop controlling a position of the wafer stage. A problem however with such a feedforward is that errors still remain present due to a finite bandwidth of the stages and of the control loops.

SUMMARY OF THE INVENTION

It is desirable to reduce a relative position error, i.e., a position error of a first movable part and a second movable part with respect to each other.

According to an embodiment of the invention, there is provided a lithographic apparatus comprising: a first movable element and a first control system to control a first position quantity of the first movable element; a second movable element and a second control system to control a second position quantity of the second movable element; and a feedforward table comprising a feedforward table programming to generate a feedforward signal in synchronism with a setpoint signal to be provided to the first and second control systems, the feedforward table to provide the feedforward signal to the first control system to influence the first position quantity so as to reduce a relative error between the first and second position quantities.

In another embodiment of the invention, there is provided a controller to control a position quantity of a first and a second movable element, the controller comprising a first control system to control a first position quantity of the first movable element; a second control system to control a second position quantity of the second movable element; and a feedforward table comprising a feedforward table programming to generate a feedforward signal in synchronism with a setpoint signal to be provided to the first and second control systems, the feedforward table to provide the feedforward signal to the first control system to influence the first position quantity so as to reduce a relative error between the first and second position quantities.

According to another embodiment of the invention, there is provided a method to control a position quantity of a first and a second movable element, the method comprising controlling a position quantity of the first movable element; controlling a position quantity of the second movable element; generating a feedforward signal in synchronism with a setpoint signal to be provided to the first and second control systems; and providing the feedforward signal to the first control system to influence the first position quantity so as to reduce a relative error between the first and second position quantities.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
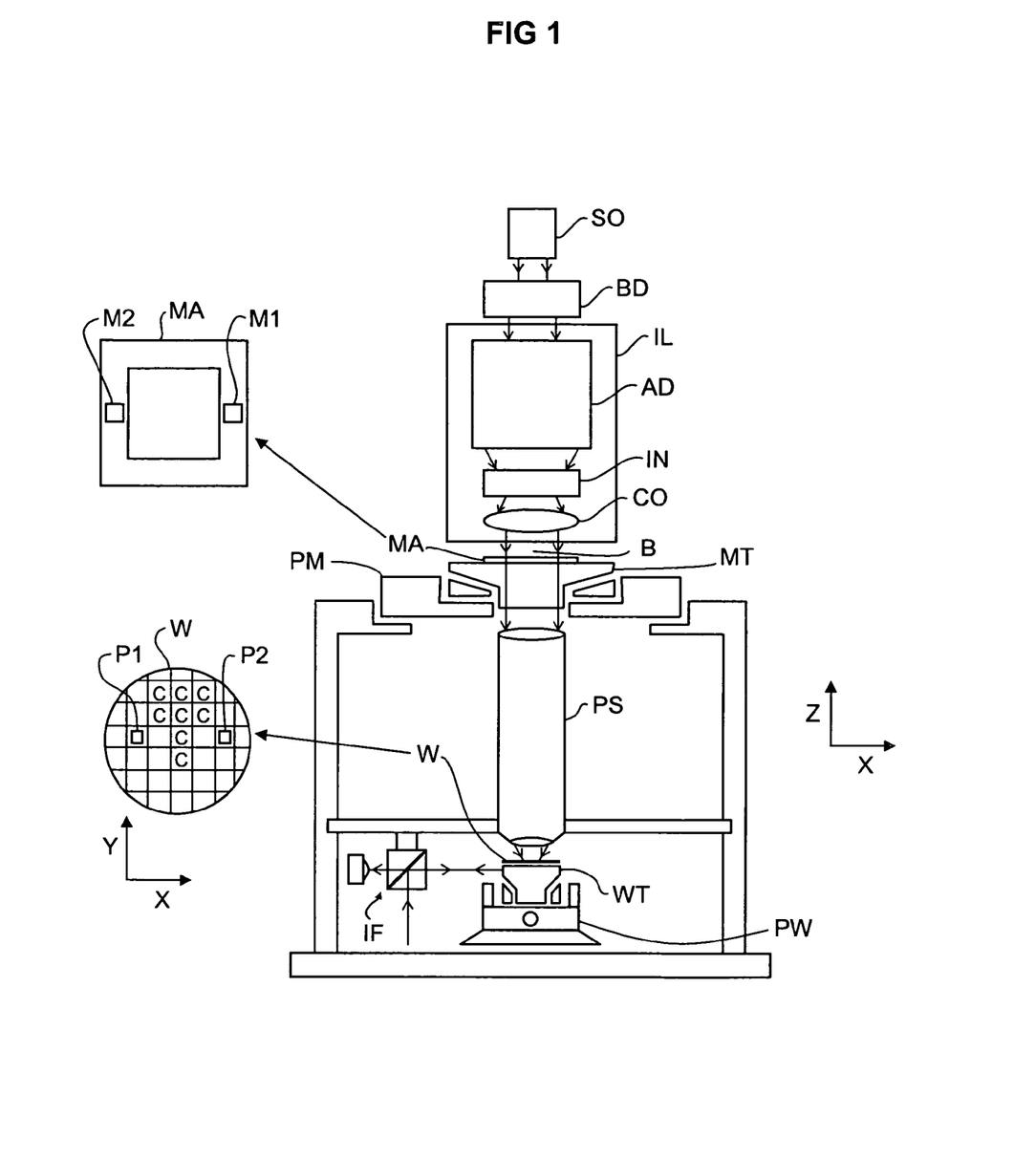
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
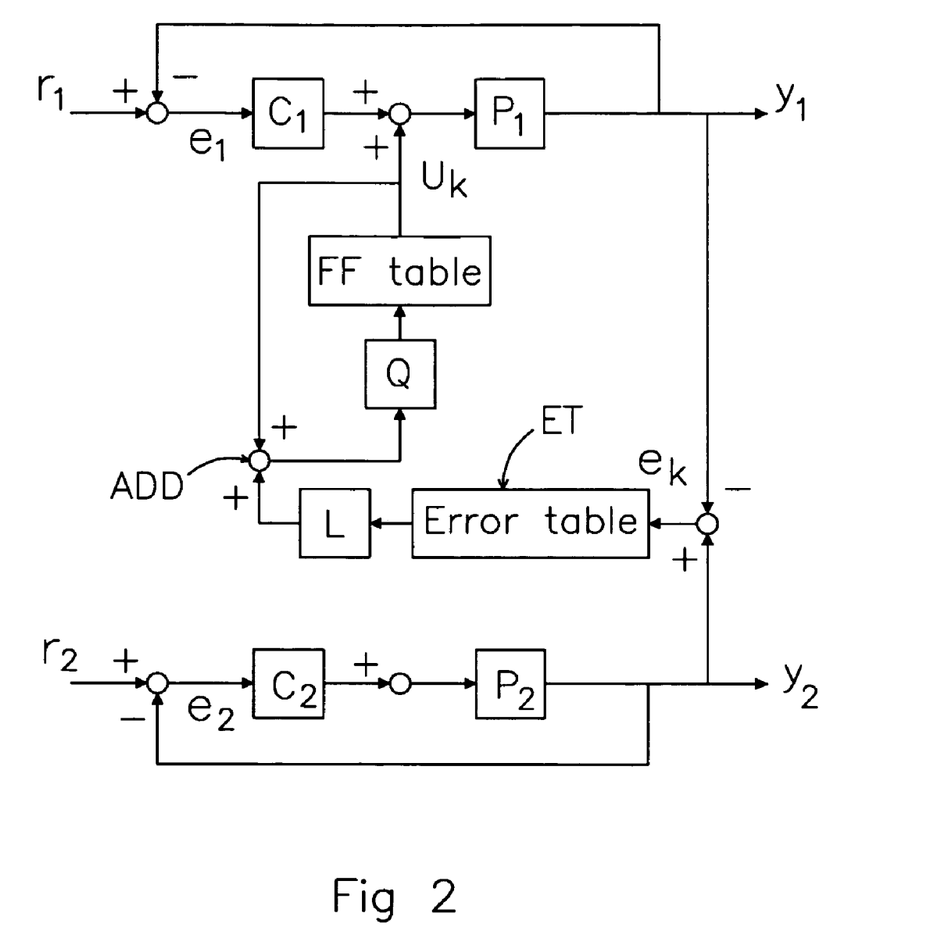
FIG. 2 schematically depicts an embodiment of a controller system of a lithographic apparatus according to the invention.

FIG. 2 schematically depicts a controller of the lithographic apparatus according to an embodiment of the invention. The controller is arranged for controlling a first movable element and a second movable element. A first control system to control a position quantity of the first movable element comprises a controller $C_1$ and a process $P_1$ in a closed loop configuration. The process $P_1$ highly schematically represents an actuator acting on the first movable element to influence a position quantity thereof, the first movable element itself and a sensor to detect a value of the position quantity of the first movable element. The controller $C_1$ together with the process $P_1$ and a feedback path forms a closed control loop. A setpoint is in operation provided to the input $r_1$, resulting in a position quantity output $y_1$. An error signal $e_1$ representing a difference between the desired position quantity (represented by $r_1$) and the actual position quantity (represented by $y_1$), is supplied as an input signal to the controller $C_1$.

FIG. 2 also depicts a second control loop comprising the second controller $C_2$ and the process $P_2$, which form a second control system to control the position quantity of the second movable element. The controller $C_2$, process $P_2$, reference input $r_2$, position quantity output $y_2$ and error signal $e_2$ substantially play a same role in a positioning of the second movable element as indicated above with reference to like elements of the first control loop. In particular, the process $P_2$ comprises an actuator to influence a position quantity of the second movable element, the second movable element itself and a sensor to detect the position quantity of the second movable element. The setpoints $r_1$ and $r_2$ may be provided by a setpoint generator (not shown). In this document, the term position quantity may refer to any type of position related quantity, such as a position, a velocity, an acceleration, a jerk, etc., or any combination of such quantities.

FIG. 2 further shows a feedforward table FF to generate a feedforward signal $u_k$. The feedforward signal is supplied to the first control loop. An object of the controller as depicted in FIG. 2 is not only to position the first and second movable parts in accordance with the first and second setpoint signal $r_1$, $r_2$, however a further object is to minimize a tracking error between the position quantities of the first and second movable parts, thus minimizing a difference between the positions $y_1$, $y_2$. To be able to achieve this object, the feedforward table is programmed to generate a feedforward signal in synchronism with the setpoint signal $r_1$, $r_2$. The feedforward table may be provided with a trigger input to trigger a running of the table, thus to trigger the providing of the feedforward signal $u_k$. The trigger may be initiated by the setpoint generator (not shown). The feedforward table may comprise a plurality of sample values, upon triggering by a trigger signal, the feedforward table being read out, thus providing a feedforward signal which at each sample time following the triggering corresponds to a value as programmed in the table, until an end of the table has been reached. An advantage of the feedforward table is that it will obviate remaining errors which would otherwise remain present due to a finite bandwidth of the control systems or disturbances causing a position error, such as nonlinear behavior of a component in the control loop. Further, an advantage of applying the feedforward table to one of the control systems only is that it enables correction of tracking errors making use of the control system and movable part which have a most favorable transfer function. If, for example, the second movable part and thus the second control system would show some degree of resonance, or if, for example, the first movable part and first control system would have a much higher bandwidth than the second movable part and respective second control system, it would be useful to apply the feedforward signal from the feedforward table to the first control loop, or in more general terms to the control loop with respect to the process which shows a most favorable transfer characteristic, as this transfer characteristic will enable to correct an error of the other one of the movable parts with respect to the other control system in a more accurate way.

FIG. 2 further shows an error table ET to register the tracking error which is formed by a difference between the position quantities of the first and second movable parts. The error table may also be triggered by a triggering as described with reference to the feedforward table, thus the registration of the tracking error also taking place, substantially similar to the reading out of the feedforward table, in response to such a trigger signal (not shown). The tracking error is defined as a difference between the position quantities of the first and second movable parts (in this example a difference between $y_1$ and $y_2$). The tracking error thus comprises a difference, e.g., a position difference, a velocity difference, an acceleration difference, a jerk difference, etc., or any combination of such quantities, the tracking error comprising a difference expressed in a same quantity as the position quantity of the first and second movable element. Also, the tracking error does not necessarily comprise the position quantities themselves (i.e., $y_1$ and $y_2$), but could also comprise position errors (i.e., $e_1$ and $e_2$). In addition, a scaling could be present between the position quantities, for example representing a lens magnification factor. The controller as depicted in FIG. 2 further comprises a processing unit to derive a next feedforward table programming from the registered tracking error and the feedforward table programming. Thus, by monitoring the error and storing the error in the error table, and deriving a new, next programming for the feedforward table from the current programming of the feedforward table and the tracking error as stored in the error table, a better approximation of the desired feedforward may be determined. Also, it is possible to establish an iterative learning, by iteratively applying a setpoint signal to the setpoint input $r_1$, and simultaneously with the applying of the setpoint signals, providing the feedforward signal $u_k$ by the feedforward table and registering a tracking error in the error table. After the error has been registered in the error table, a next feedforward table programming is derived from the registered tracking error in combination with the current feedforward table programming. The new feedforward table programming which has been obtained is stored in the feedforward table and the process of applying the setpoint signals, applying the feedforward signal and registering the error in the error table is then repeated. Due to the iterative nature, and making use of a suitable transfer characteristic in the processing unit, an iterative approximation of a feedforward table programming will be obtained which results in a value of the tracking error which approaches zero, after a suitable number of iterations. An advantage of this approach is that the processing unit only requires to comprise an inverse of a process sensitivity of the first control system (see below), and as the first control system in this example comprises a transfer function which is more favorable (because of having i.e., a higher bandwidth, less tendency to resonance, etc.) than the second control system or second movable element, an approximation of the inverse process sensitivity of the first control system can be established in a more accurate way than an inverse process sensitivity of the second control system, thus resulting in a more accurate deriving of the programming for the feedforward table from the tracking error as registered in the table. Hence, a more accurate feedforward function may be determined.

The processing unit in this exemplary embodiment comprised a feedforward signal calculator L to determine a feedforward increment signal from the tracking error registered in the error table. Further, the processing unit may comprise an adder to add the feedforward increment signal to the feedforward table programming to obtain an added incremented feedforward table programming. Also, the processing unit may comprise a robustification filter Q to filter the added incremented feedforward table programming to obtain the next feedforward table programming which is to be stored in the feedforward table. The feedforward signal calculator L may comprise a filter that substantially equals an inverse process sensitivity of the first control system, thus may comprise a transfer function substantially equal to:

$$\frac{1 + P_1 C_1}{P_1}$$

thus enabling determination of a force that will result in a contribution to the position error that is opposite to that of the previous error signal. The feedforward increment signal which provides feedforward information derived from the tracking error as registered in the error table, is then added by the adder ADD to the current programming of the feedforward table (which resulted in the error registered in the error table). The added incremented feedforward table programming thus obtained is then filtered by the robustification filter to keep an iterative approximation stable, e.g., to avoid any oscillations or instability of the iterative approximation loop thus formed. In common physical implementation, the process $P_1$, and likewise the process $P_2$, comprises more poles than zeros (as a physical system comprises a finite bandwidth), and thus the inverse process sensitivity comprised in the transfer function of the feedforward signal calculator L will comprise more zeros than poles. To make such a feedforward signal calculator transfer function implementable, a low pass filter is added to the transfer function of the feedforward signal calculator. The feedforward signal calculation thus comprising a transfer function which substantially equals the inverse process sensitivity in a relevant frequency range, e.g., in a frequency range below a cut-off frequency or attenuation frequency range of the low pass filter. A transfer function of the robustification filter Q (also known as robustness filter) may comprise a low pass filter which filters out those frequencies for which the transfer function of the feedforward signal calculator L is no longer a good approximation of the inverse process sensitivity, hence avoiding any disturbance of the iterative approximation due to high frequency disturbance components.

The controller as depicted in FIG. 2 may be applied for controlling position quantities of any first and second movable element, in particular in the lithographic apparatus the controller may be applied to control a tracking of the reticle stage (also referred to as patterning device) and the substrate table (also referred to as substrate support) with respect to each other. Advantageously, the first movable part is chosen to be the one having the most favorable transfer function of the first and second movable parts, i.e., the transfer function which comprises a highest bandwidth, a least tendency to resonance, etc., as a feedforward to be fed into the first control system will result in a more accurate counter acting of any tracking error, thus in a higher relative accuracy of the position quantities of the first and second movable elements with respect to each other, due to the more favorable transfer characteristics of the first movable part and the first control system.

The controller as described with reference to FIG. 2 may not only be applied in a lithographic apparatus, but may be used in any other apparatus or system in which a position quantity of a first movable element and a position quantity of a second movable element are to track each other as optimal as possible, thus reducing a tracking error between the first and second movable element.

The method according to an embodiment of the invention comprises controlling a position quantity of the first movable element, controlling a position quantity of the second movable element, generating a feedforward signal in synchronization with a setpoint signal to be provided to the first and second control systems, and providing the feedforward signal to the first control system to at least partly correct the position quantity of the first movable element for a tracking error between the first and second movable elements. Advantageous embodiments of the method according to an embodiment of the invention and the controller according to an embodiment of the invention are identical or similar to those described with reference to the lithographic apparatus according to an embodiment of the invention.

Figure 3A:
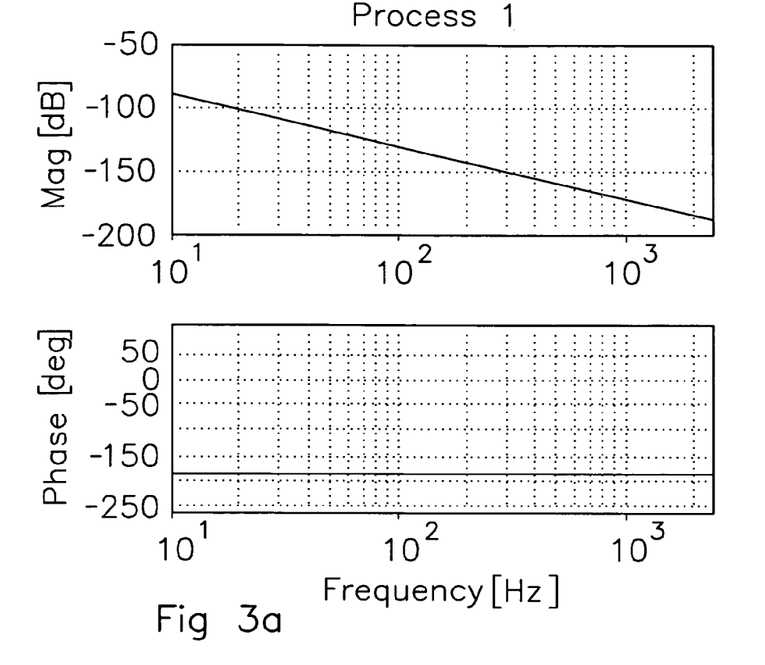
FIGS. 3a and b depict a frequency response diagram of a reticle stage and a wafer stage of a lithographic apparatus according to the invention.
Figure 3B:
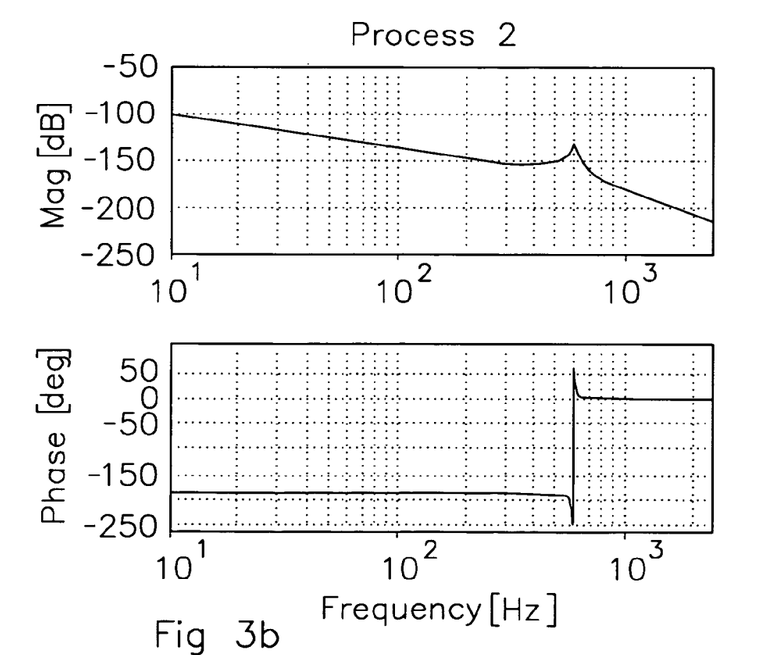

An example of an iterative learning for reducing a tracking error will now be described with reference to FIGS. 3-5.

In this example, the first movable element comprises a reticle stage and the second movable element comprises a wafer stage of the lithographic apparatus. The reticle stage is modeled as a mass only while the wafer stage is modeled as having a resonance peak at 600 Hz. A frequency plot of the transfer function of the reticle stage is shown in FIG. 3a showing both magnitude and phase versus frequency, while a transfer function of the wafer stage is shown in 3b, also showing a magnitude and phase versus frequency. FIG. 4 shows a time response of the reticle stage, the wafer stage and a relative error, thus a tracking error there between in response to a setpoint signal. In this example, the position quantity of the reticle stage comprises a position of the reticle stage and the position quantity of the wafer stage comprises a position of the wafer stage. FIG. 4 shows an acceleration ACC, a position error $e_1$ of the reticle stage and a position error $e_2$ of the wafer stage. Further, FIG. 4 shows a relative error, indicated as ews_rs which forms a difference between the errors $e_1$ and $e_2$. A resonance peak of the wafer stage, as has been depicted in FIG. 3b, also becomes visible in the error signal $e_2$. Further, it can be seen that the error $e_2$ is substantially larger than the error $e_1$.

Due to the relatively high value of the error $e_2$, a feedforward applied to the wafer stage would be able to reduce this error to an amount which is less than the error $e_2$, however due to the relatively unfavorable transfer characteristics of the wafer stage, a remaining absolute error of the wafer stage will be high, especially if compared to a remaining absolute error of the reticle stage that could be achieved when applying a feedforward to the reticle stage. In particular, using an inverse process sensitivity filter in the feedforward signal calculator L is more complicated for the second moveable element than it is for the first moveable element. This becomes clear when realizing that for high frequencies, the term PC in the numerator of the inverse process sensitivity tends to zero, either by the controller selection C or the fact that P is smaller for higher frequencies, as illustrated in FIGS. 3a and 3b. For higher frequencies, the inverse process sensitivity then tends to 1/P, and because P tends to zero, the inverse process sensitivity tends to infinity (for higher frequencies). To avoid this in an actual implementation, low-pass filters may be included in L. The order of this low-pass filtering relates to the order of 1/P, and as can be seen in FIGS. 3a and 3b, the second moveable element uses a higher-order low-pass filtering than the first moveable element. In the end, L is a better approximation of the inverse process sensitivity for the first moveable element than it is for the second moveable element, hence creating a better feedforward. In addition, the robustification filter Q filters those frequencies for which L is not a good approximation for the real inverse process sensitivity. Hence, also the robustification filter Q does not need to filter as much for the first moveable element as it does for the second moveable element. Again, this leads to a better feedforward for the first moveable element.

Figure 4:
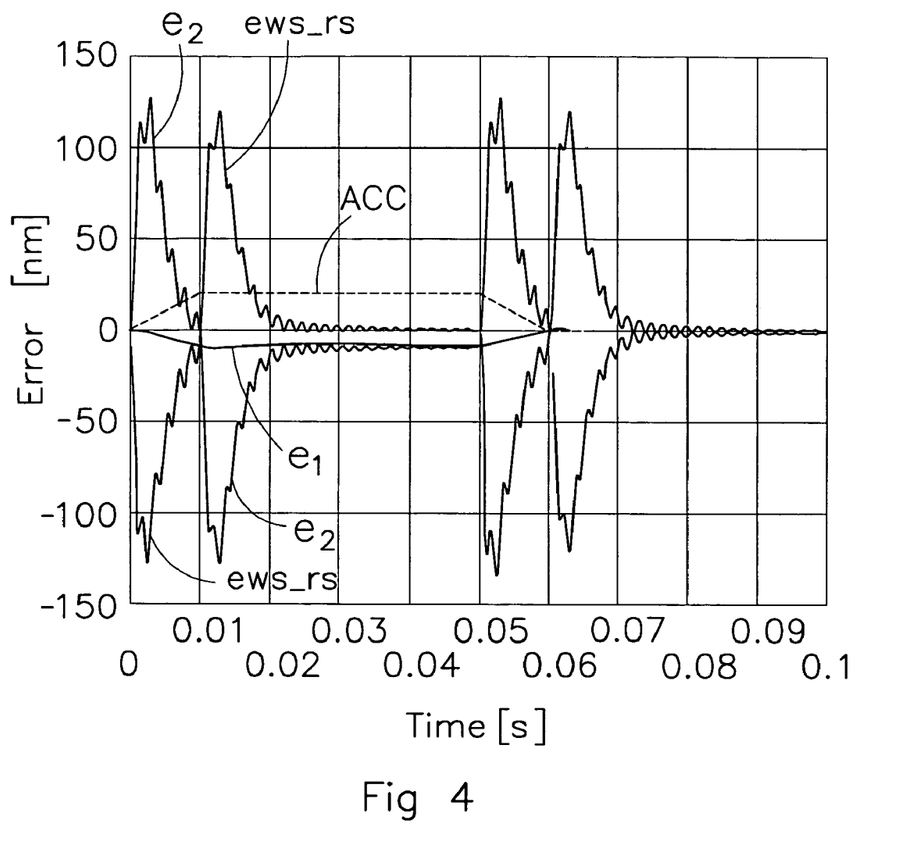
FIG. 4 depicts a graphical view of wafer stage, reticle stage and tracking error versus time of an embodiment of the lithographic apparatus according to the invention.
Figure 5A:
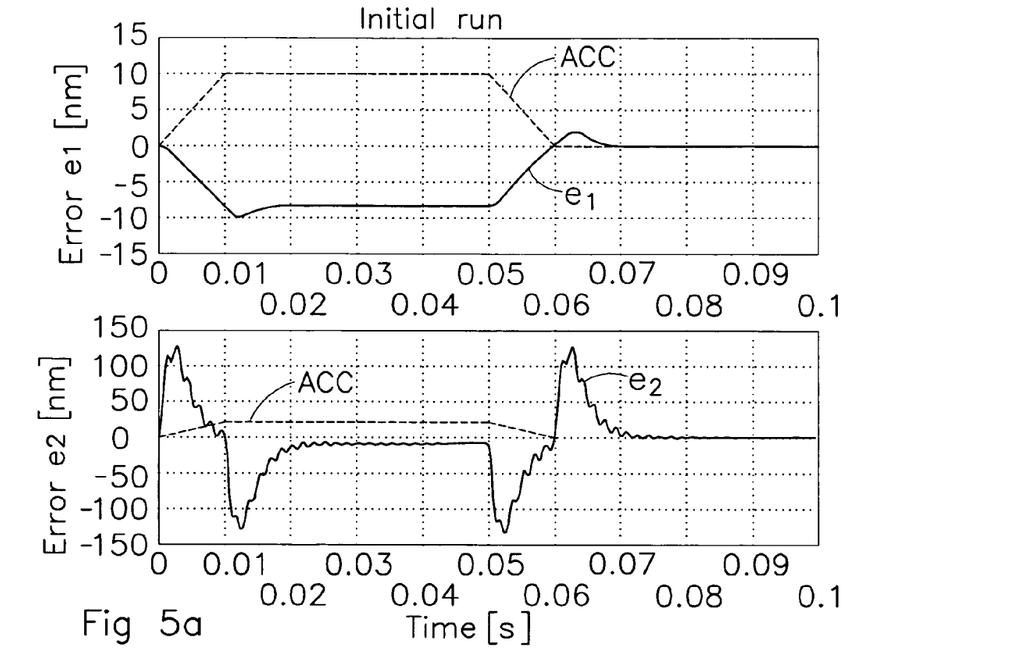
FIG. 5a-d depicts results obtained when applying a separate iterative learning mechanism for the reticle stage and a separate iterative learning mechanism for the wafer stage.
Figure 5B:
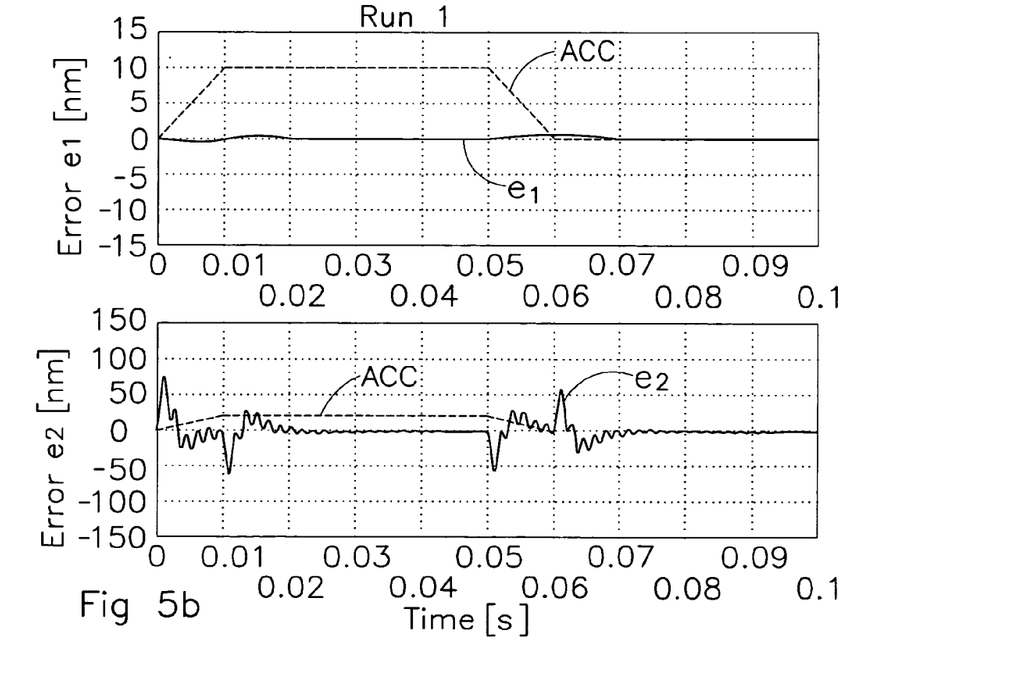
Figure 5C:
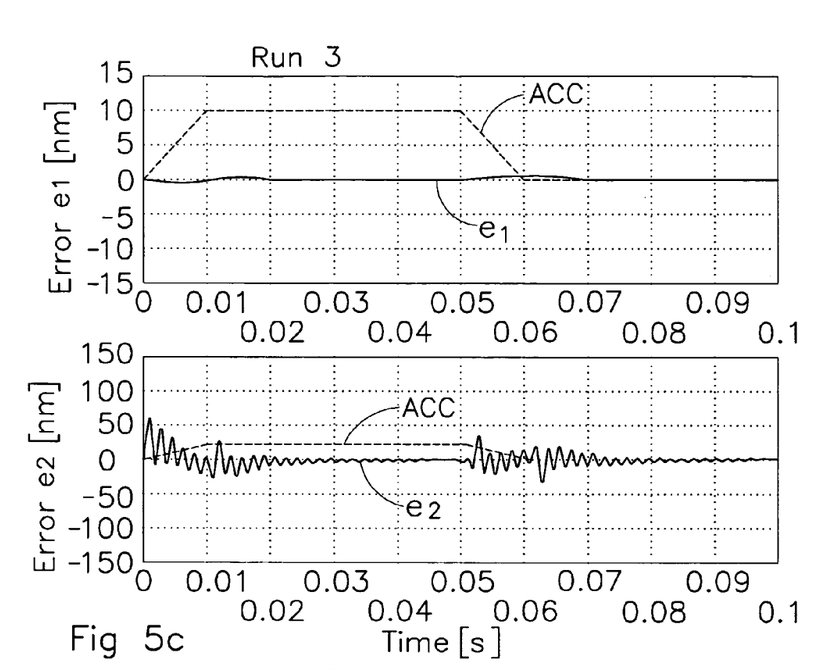
Figure 5D:
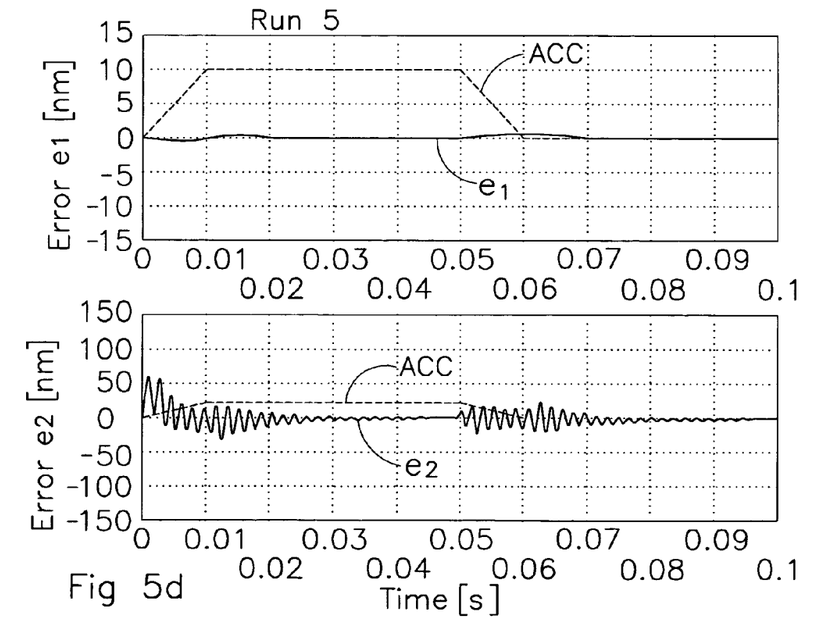

Thus, applying individual feedforwards to both the reticle stage and the wafer stage to correct absolute errors thereof would provide for an improvement as compared to the errors depicted in FIG. 4, however due to the absolute magnitude of the error $e_2$, and thus due to the remaining error that would be left over even when applying a feedforward that would provide an as good as possible approximation to as far as possible reduce the absolute error $e_2$, a relative error would still be comparatively high. This is illustrated by FIGS. 5a-d where FIG. 5a shows an absolute error $e_1$ and an absolute error $e_2$ at an initial run, FIG. 5b shows these errors at a first iterative approximation of the feedforward where the feedforward for the reticle stage is determined based on an absolute error of the reticle stage at the initial run and where the feedforward for the substrate stage is determined based on an absolute error of the substrate stage $e_2$ at the initial run. Likewise, FIG. 5c shows the absolute errors $e_1$ and $e_2$ in the third run as a result of feedforwards which are determined based on feedforwards as applied in the second run which preceded the third run and based on absolute errors of the reticle stage and wafer stage respectively, as registered in the second run. The same holds, mutatis mutandis for run 5 which thus shows the absolute errors $e_1$ and $e_2$ in the fifth run, the feedforwards applied in the fifth run thus being based on feedforwards applied in the fourth run which preceded the fifth run and the absolute error of that stage, thus the absolute error of $e_1$ of the reticle stage with respect to the absolute error $e_2$ of the wafer stage. It can be observed from FIG. 5d that the remaining error $e_1$ of the reticle stage has been compensated to a very high degree by a reticle stage feedforward while despite using the same mechanism on the wafer stage feedforward the wafer stage position error is still high. As a result of the relatively high remaining absolute error of the wafer stage, a tracking error (relative error) will also show such a high value.

Figure 6A:
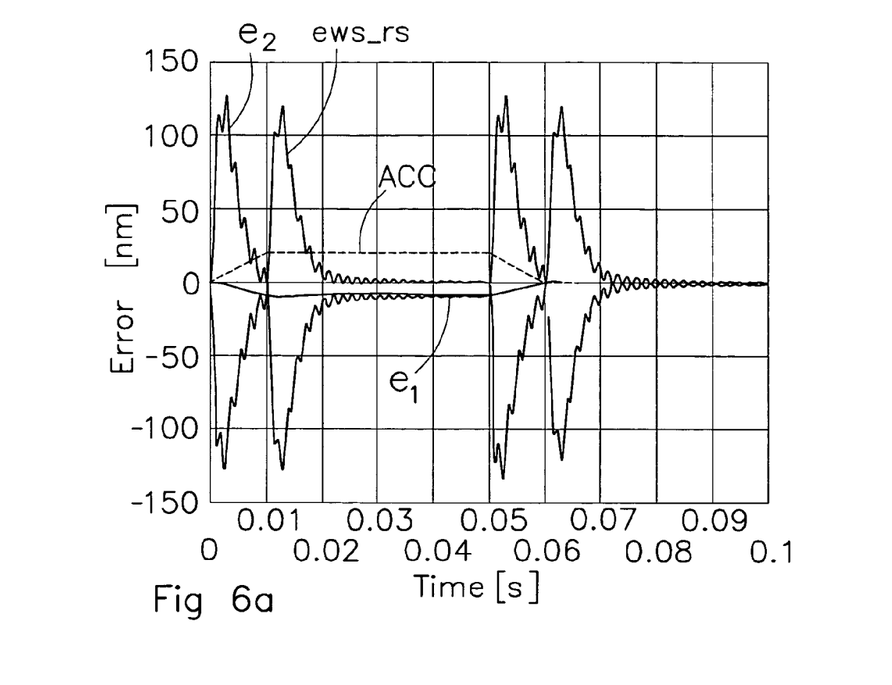
FIG. 6a-d depict reticle stage, wafer stage and relative errors for successive iterative approximations of a programming of the control system according to the invention.
Figure 6B:
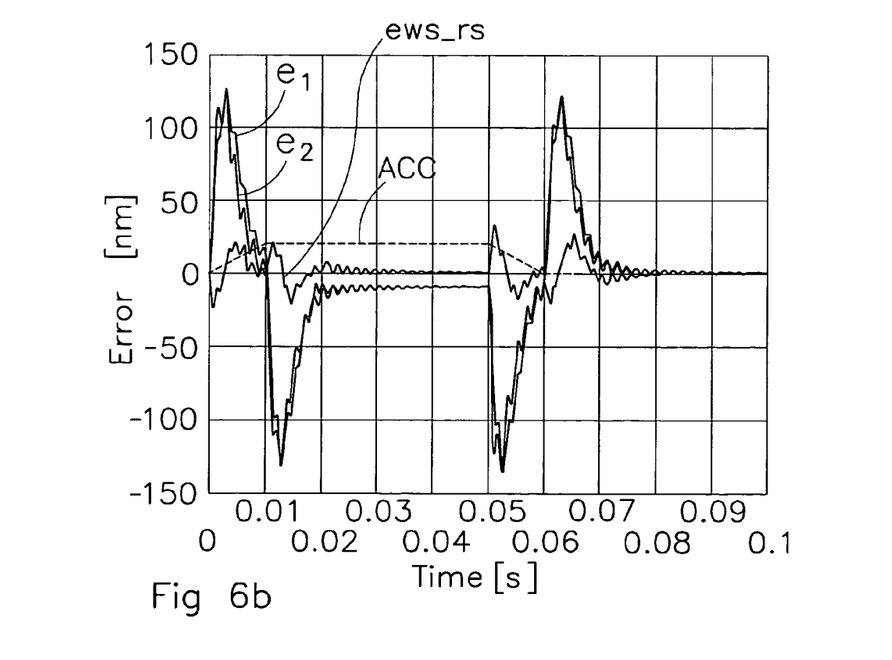
Figure 6C:
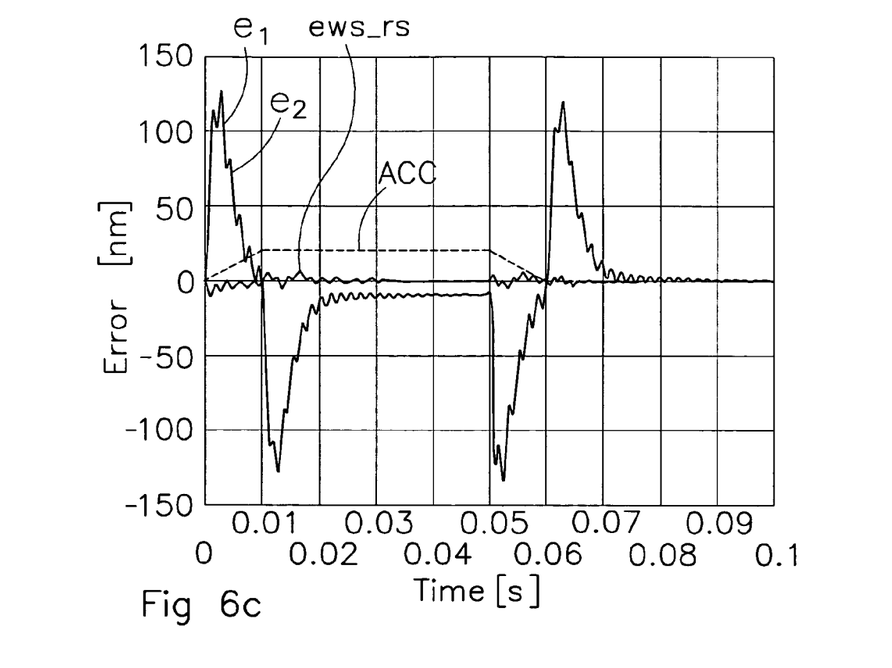
Figure 6D:
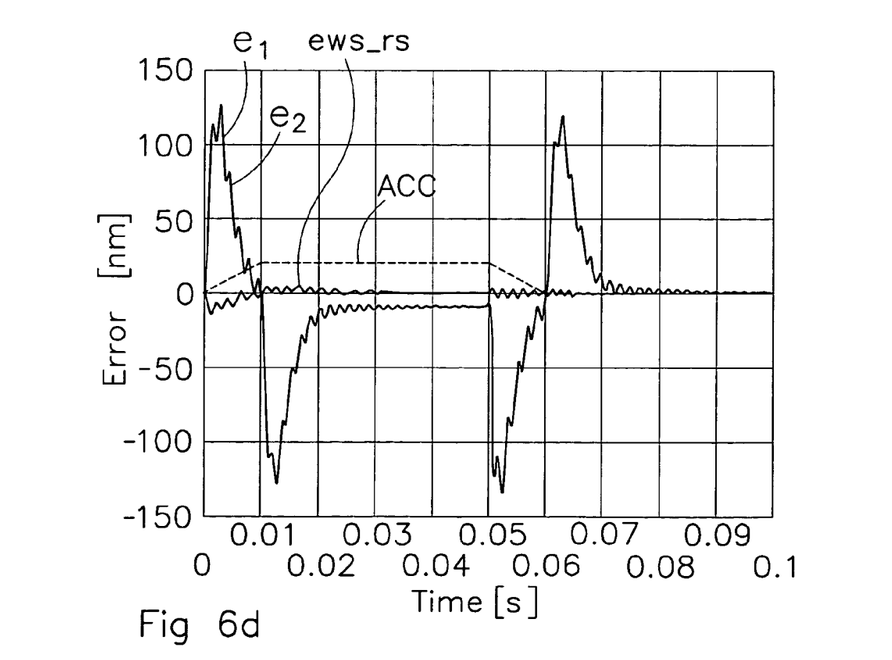

FIGS. 6a-d now show an example wherein a feedforward is applied to the reticle stage only, the feedforward to compensate for a relative error between the reticle stage and the wafer stage position quantities. The example as depicted in FIGS. 6a-d is an embodiment which makes use of the controller as depicted in and described with reference to FIG. 2. Similarly to FIG. 4, FIG. 6a shows the absolute errors $e_1$ and $e_2$ of the reticle stage and the wafer stage respectively, as well as the relative error ews_rs therebetween. Further, an acceleration ACC is shown. FIGS. 6b-6d respectively show a first, third and fifth run of an iterative approximation of a programming of the feedforward table. After each run, a feedforward table programming for the feedforward table which provides a feedforward signal to the reticle stage is determined based on a programming of the feedforward table at a previous run in combination with the relative error ews_rs as detected at the previous run. At the first run, it can already be seen that $e_1$ starts to show a behavior which becomes similar to a value of $e_2$, and as a result thereof the relative error ews_rs decreases. At the third and fifth run, it can be observed that $e_1$ becomes substantially similar to $e_2$, $e_2$ as such retaining its initial value as observed in the initial run, but due to the fact that $e_1$ becomes substantially similar to $e_2$, the relative error ews_rs significantly reduces. Thus, in the runs 1-5 the iterative feedforward learns how to provide an optimum feedforward to the reticle stage such that a relative error is significantly reduced, in fact the feedforward arranges for an absolute error of the reticle stage which becomes substantially similar to an absolute error of the wafer stage, thus a relative error significantly decreasing. At the first run, the relative error ews_rs equals approximately 120 nm maximum, while at the fifth run this relative error has already been decreased to 2 nm. A reason why this strong improvement is possible is because of the favorable transfer characteristics of the reticle stage requiring less filtering in L and Q, as explained above. Therefore, the learning system as depicted in FIG. 2 can be made to compensate for the higher frequency error of the wafer stage, such as the wafer stage resonance which cannot be compensated by the wafer stage itself, see FIGS. 5a-d where it is shown that an iterative learning mechanism on each of the stages individually, thus an iterative learning mechanism on the reticle stage and an iterative learning mechanism on the wafer stage still result in a substantial wafer stage error and thus a substantial relative error.

The first and second position quantity may be on a same scale, however it is also possible that some type of scaling is in between them. As an example, due to an optical magnification, a scaling between the reticle and the wafer stage may be present. Such a scaling may be e.g., a factor 1:4. In such a case, the relative error will not be determined by taking a difference between the absolute values of a reticle stage error and a wafer stage error, but instead thereof the scaling will be compensated before determining the difference. Thus, the relative error or a tracking error may also comprise a scaled relative or tracking error.

In addition, it should be noted that the control scheme of FIG. 2 only shows certain elements relating to aspects of the current invention. Other elements, such as acceleration feedforwards, are not shown but will be present in practice.

In this document, the term tracking error and relative error are used, however these are to be understood as referring to the same type of error.

Furthermore, it will be clear to the skilled person that the term feedforward as applied in this document may also refer to the feedforward table programming. Thus, in a context of "the feedforward provides for . . ." the skilled person will understand that this is to be interpreted as "the feedforward table programming provides for . . . ."

The iterative learning mechanism according to an embodiment of the invention thus enables a reduction of a relative error between position quantities of the first and second movable parts, as it enables to make use of the first stage which has a more favorable transfer characteristic (e.g., less resonance etc., such that a good approximation of the inverse process sensitivity in the feedforward signal calculator L is possible) to determine a feedforward table programming such that the first movable part follows the error of the second movable part with a high degree of accuracy, thus reducing a relative error to a large extent.

The feedforward according to the invention may not only be applied in a context of controlling a first and second position quantity, however instead it may also be applied in a context of controlling any type of physical quantity, such as a first and second temperature, or a first and second energy level (for example, of a laser source).

The first and second control systems may be implemented using analogue and/or digital electronics, e.g., making use of any type of processing device, such as an electronic microprocessor, microcontroller, etc. The feedforward table programming may be stored in any type of memory, such as an electronic memory.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a first movable element and a first control system to control a first position quantity of the first movable element;
    a second movable element and a second control system to control a second position quantity of the second movable element;
    a feedforward table comprising feedforward table data and configured to be used to generate a feedforward signal in synchronism with a setpoint signal to be provided to the first and second control systems, wherein the feedforward table is configured to provide the feedforward signal to the first control system to adapt the first position quantity so as to reduce a relative error between the first and second position quantities;
    an error table configured to register a tracking error between the position quantities of the first and second movable elements in response to the setpoint signals provided to the first and second control systems; and a processing unit to derive a next feedforward table data from the registered tracking error and the feedforward table data.

2. The lithographic apparatus according to claim 1, wherein the processing unit comprises:
a feedforward signal calculator to determine a feedforward increment signal from the tracking error registered in the error table;
an adder to add the feedforward increment signal to the feedforward table programming to obtain an added incremented feedforward table data; and
a robustification filter to filter the added incremented feedforward table data to obtain the next feedforward table data to be stored in the feedforward table.

3. The lithographic apparatus according to claim 2, wherein the feedforward signal calculator comprises a transfer function that substantially equals an inverse process sensitivity of the first control system in a relevant frequency range.

4. The lithographic apparatus according to claim 3, wherein the feedforward signal calculator further comprises a low pass filter.

5. The lithographic apparatus according to claim 1, wherein the first movable part comprises a pattern support configured to support a patterning device, the patterning device being configured to impart a radiation beam with a pattern in its cross-section to form a patterned radiation beam.

6. The lithographic apparatus according to claim 1, wherein the second movable part comprises a substrate support constructed to hold a substrate.

7. The lithographic apparatus according to claim 1, wherein the position quantity comprises one or more of a position, a velocity, an acceleration, a jerk and a snap.

8. The lithographic apparatus according to claim 1, further comprising a trigger to trigger generation of the feedforward signal.

9. The lithographic apparatus according to claim 8, wherein the trigger is provided in the feedforward table.

10. The lithographic apparatus according to claim 8, wherein the trigger is initiated by a setpoint signal generator that is configured to generate the setpoint signal.

11. A controller to control a position quantity of a first and a second movable element, the controller comprising:
a first control system to control a first position quantity of the first movable element;
a second control system to control a second position quantity of the second movable element;
a feedforward table comprising feedforward table data and configured to be used to generate a feedforward signal in synchronism with a setpoint signal to be provided to the first and second control systems, the feedforward table configured to provide the feedforward signal to the first control system to adapt the first position quantity so as to reduce a relative error between the first and second position quantities;
an error table to register the tracking error between the position quantities of the first and second movable elements in response to the setpoint signals provided to the first and second control systems; and a processing unit to derive a next feedforward table data from the registered tracking error and the feedforward table data.

12. The controller according to claim 11, wherein the processing unit comprises:
a feedforward signal calculator to determine a feedforward increment signal from the tracking error registered in the error table;
an adder to add the feedforward increment signal to the feedforward table data to obtain an added incremented feedforward table programming; and
a robustification filter to filter the added incremented feedforward table data to obtain the next feedforward table programming to be stored in the feedforward table.

13. The controller according to claim 11, further comprising a trigger to trigger generation of the feedforward signal.

14. The controller according to claim 13, wherein the trigger is provided in the feedforward table.

15. The controller according to claim 13, wherein the trigger is initiated by a setpoint signal generator that is configured to generate the setpoint signal.

16. A method to control a position quantity of a first and a second movable element, the method comprising
controlling a position quantity of the first movable element;
controlling a position quantity of the second movable element;
generating a feedforward signal in synchronism with a setpoint signal to be provided to the first and second control systems;
providing the feedforward signal to the first control system to adapt the first position quantity so as to reduce a relative error between the first and second position quantities;
registering a tracking error between the position quantities of the first and second movable elements in response to the setpoint signals provided to the first and second control systems;
looking up feedforward data from a feedforward table as part of the generating; and
deriving a next feedforward table data from the registered tracking error and the feedforward table data.

17. The method according to claim 16, wherein the deriving comprises:
determining a feedforward increment signal from the tracking error registered in the error table;
adding the feedforward increment signal to the feedforward table data to obtain an added incremented feedforward table data;
filtering the added incremented feedforward table data to obtain the next feedforward table data; and
storing the next feedforward table data in the feedforward table.

18. The method of claim according to claim 16, wherein the generating includes triggering generation of the feedforward signal based on a signal provided by a setpoint signal generator that is configured to generate the setpoint signal.

* * * * *